US012639011B2

(12) United States Patent (10) Patent No.: US 12,639,011 B2
Majumdar et al. (45) Date of Patent: May 26, 2026

(54) ROW HAMMER TELEMETRY

(71) Applicant: Micron Technology, Inc., Boise, ID (US)

(72) Inventors: Amitava Majumdar, Boise, ID (US); Anandhavel Nagendrakumar, Boise, ID (US); Mohammed Ebrahim Hargan, Boise, ID (US); Scott Garner, Boise, ID (US); Danilo Caraccio, Milan (IT); Daniele Balluchi, Cernusco sul Naviglio (IT); Chia Wei Chang, Boise, ID (US); Ankush Lal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/929,332

(22) Filed: Oct. 28, 2024

(65) Prior Publication Data

US 2025/0053343 A1 Feb. 13, 2025

Related U.S. Application Data

(63) Continuation of application No. 18/121,874, filed on Mar. 15, 2023, now Pat. No. 12,131,071.

(60) Provisional application No. 63/319,815, filed on Mar. 15, 2022.

(51) Int. Cl.
*G06F 3/06* (2006.01)
*G11C 11/406* (2006.01)

(52) U.S. Cl.
CPC .......... *G06F 3/0659* (2013.01); *G06F 3/0619* (2013.01); *G06F 3/0673* (2013.01); *G11C 11/406* (2013.01)

(58) Field of Classification Search
None
See application file for complete search history.

(56) References Cited

U.S. PATENT DOCUMENTS

| | | | |
|---|---|---|---|
| 9,032,141 B2 | 5/2015 | Bains et al. | |
| 10,446,216 B2 | 10/2019 | Oh | |
| 10,790,005 B1* | 9/2020 | He | G11C 11/40615 |
| 11,282,561 B2 | 3/2022 | Nale et al. | |
| 2014/0085995 A1 | 3/2014 | Greenfield et al. | |
| 2018/0061483 A1 | 3/2018 | Morgan | |
| 2020/0082873 A1* | 3/2020 | Wolff | G11C 11/40615 |
| 2021/0057022 A1* | 2/2021 | Jenkinson | G11C 11/4087 |
| 2021/0280236 A1 | 9/2021 | Gans | |
| 2021/0365316 A1* | 11/2021 | Nale | G11C 29/4401 |
| 2022/0068348 A1 | 3/2022 | Bennett | |

(Continued)

*Primary Examiner* — Yaima Rigol

(74) *Attorney, Agent, or Firm* — Brooks, Cameron & Huebsch, PLLC

(57) ABSTRACT

An apparatus can include a number of memory devices and a memory controller coupled to one or more of the number of memory devices. The memory controller can include a row hammer detector. The memory controller can be configured increment for a first time period a row counter in a first data structure and a refresh counter. The memory controller can be configured to increment for a second time period a row counter in a second data structure and the refresh counter. The memory controller can be configured to determine that a value of the refresh counter exceeds a refresh threshold and responsive to the determination that the value of the refresh counter exceeds the refresh threshold, issue a notification.

20 Claims, 8 Drawing Sheets

(56) References Cited

U.S. PATENT DOCUMENTS

| 2022/0199148 A1* | 6/2022 | Hong | ................... | G11C 11/4091 |
| 2022/0270661 A1* | 8/2022 | Cho | ...................... | G11C 11/406 |

* cited by examiner

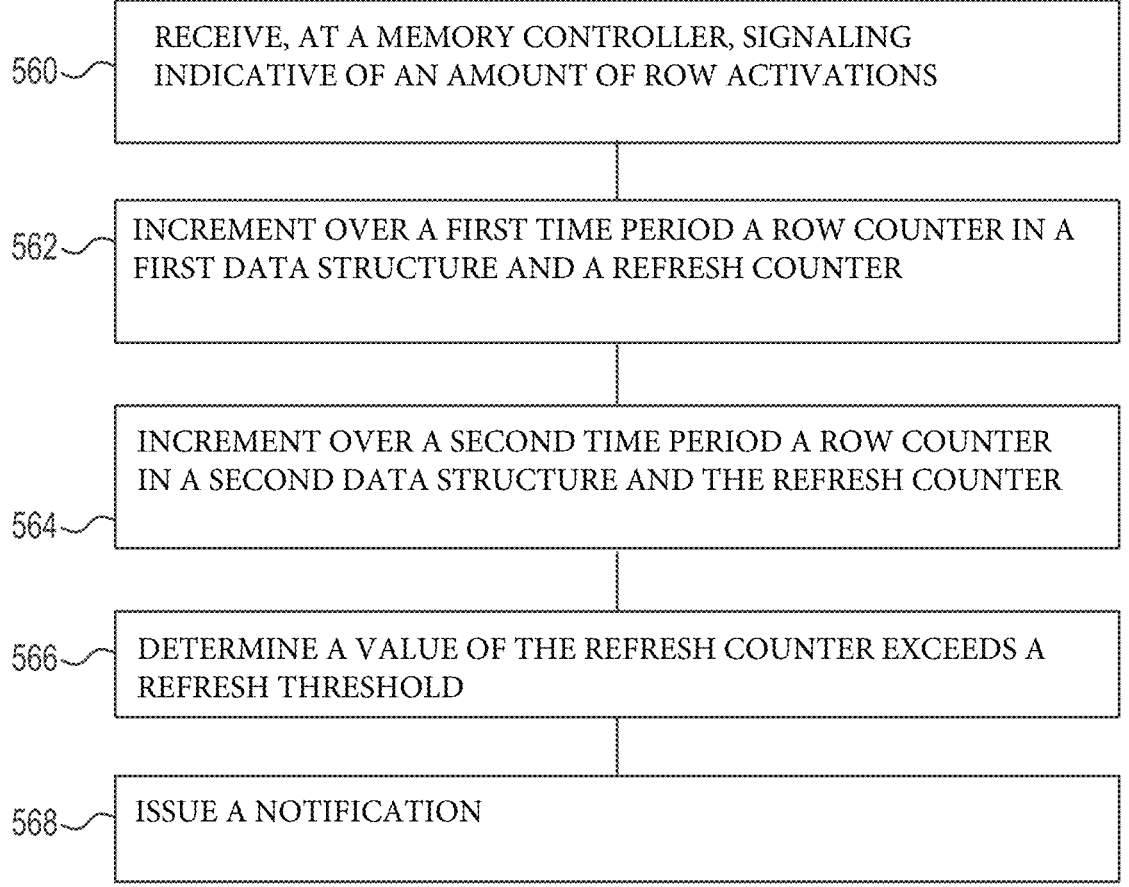

560 — RECEIVE, AT A MEMORY CONTROLLER, SIGNALING INDICATIVE OF AN AMOUNT OF ROW ACTIVATIONS

562 — INCREMENT OVER A FIRST TIME PERIOD A ROW COUNTER IN A FIRST DATA STRUCTURE AND A REFRESH COUNTER

564 — INCREMENT OVER A SECOND TIME PERIOD A ROW COUNTER IN A SECOND DATA STRUCTURE AND THE REFRESH COUNTER

566 — DETERMINE A VALUE OF THE REFRESH COUNTER EXCEEDS A REFRESH THRESHOLD

568 — ISSUE A NOTIFICATION

FIG. 5

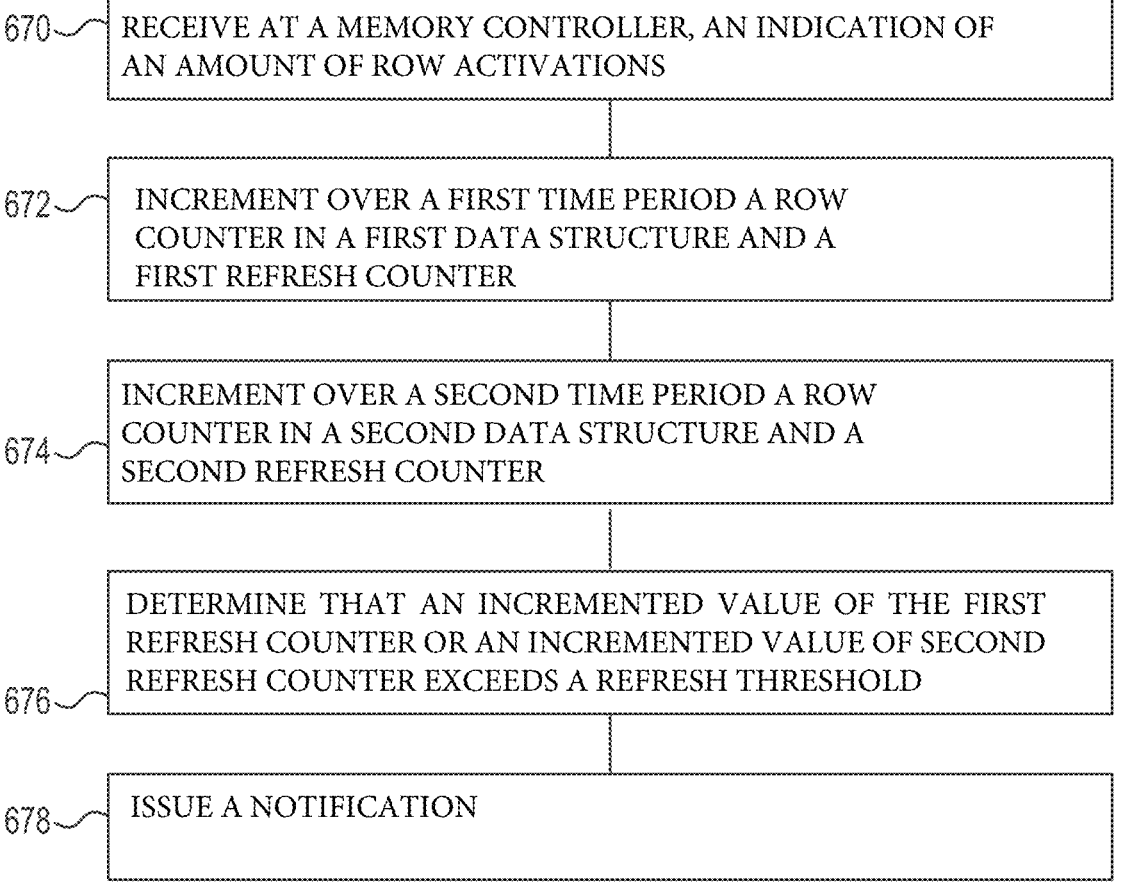

670 — RECEIVE AT A MEMORY CONTROLLER, AN INDICATION OF AN AMOUNT OF ROW ACTIVATIONS

672 — INCREMENT OVER A FIRST TIME PERIOD A ROW COUNTER IN A FIRST DATA STRUCTURE AND A FIRST REFRESH COUNTER

674 — INCREMENT OVER A SECOND TIME PERIOD A ROW COUNTER IN A SECOND DATA STRUCTURE AND A SECOND REFRESH COUNTER

676 — DETERMINE THAT AN INCREMENTED VALUE OF THE FIRST REFRESH COUNTER OR AN INCREMENTED VALUE OF SECOND REFRESH COUNTER EXCEEDS A REFRESH THRESHOLD

678 — ISSUE A NOTIFICATION

FIG. 6

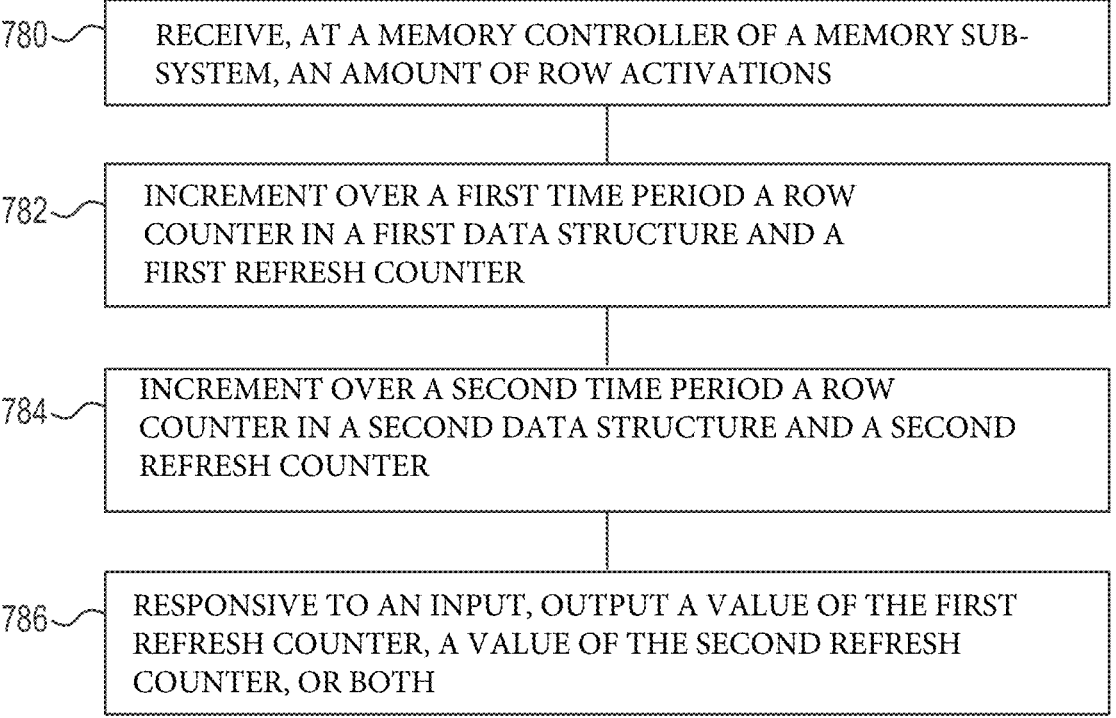

780 — RECEIVE, AT A MEMORY CONTROLLER OF A MEMORY SUB-SYSTEM, AN AMOUNT OF ROW ACTIVATIONS

782 — INCREMENT OVER A FIRST TIME PERIOD A ROW COUNTER IN A FIRST DATA STRUCTURE AND A FIRST REFRESH COUNTER

784 — INCREMENT OVER A SECOND TIME PERIOD A ROW COUNTER IN A SECOND DATA STRUCTURE AND A SECOND REFRESH COUNTER

786 — RESPONSIVE TO AN INPUT, OUTPUT A VALUE OF THE FIRST REFRESH COUNTER, A VALUE OF THE SECOND REFRESH COUNTER, OR BOTH

FIG. 7

ROW HAMMER TELEMETRY

PRIORITY INFORMATION

This application is a Continuation of U.S. application Ser. No. 18/121,874 filed on Mar. 15, 2023, which claims the benefit of U.S. Provisional Application Ser. No. 63/319,815, filed on Mar. 15, 2022, the contents of which are incorporated herein by reference.

TECHNICAL FIELD

Embodiments of the disclosure relate generally to memory sub-systems, and more specifically, relate to row hammer telemetry.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 5 is a flow diagram of a method employing row hammer telemetry in accordance with a number of embodiments of the present disclosure.

FIG. 6 is a flow diagram of another method employing row hammer telemetry in accordance with a number of embodiments of the present disclosure.

FIG. 7 is a flow diagram of yet another method employing row hammer telemetry in accordance with a number of embodiments of the present disclosure.

DETAILED DESCRIPTION

Figure 1:
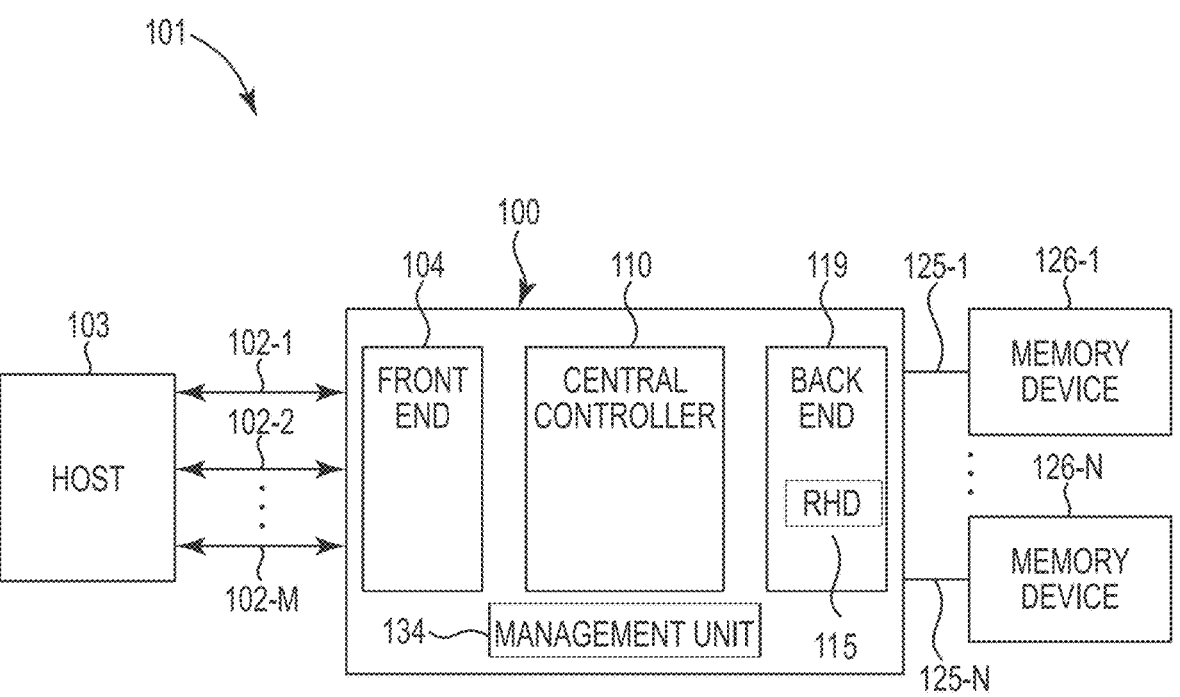
FIG. 1 is a functional block diagram of a computing system including a memory controller in accordance with a number of embodiments of the present disclosure.

Memory controllers for row hammer telemetry are described. The memory controller can be included in an apparatus such as a memory system. A memory sub-system can be a storage system, storage device, a memory module, or a combination of such. An example of a memory sub-system is a storage system such as a solid-state drive (SSD). In some embodiments, the memory system can be a non-deterministic memory protocol compliant memory system such as a compute express link (CXL) compliant memory system. For instance, the host interface can be managed with CXL protocols and be coupled to the host via an interface configured for a peripheral component interconnect express (PCIe) protocol. CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall memory system cost. CXL is designed to be an industry open standard interface for high-speed communications, as accelerators are increasingly used to complement CPUs in support of emerging applications such as artificial intelligence and machine learning. CXL technology is built on the PCIe infrastructure, leveraging PCIe physical and electrical interfaces to provide advanced protocol in areas such as input/output (I/O) protocol, memory protocol (e.g., initially allowing a host to share memory with an accelerator), and coherency interface. Another memory system closely related to CXL based memory extenders are Open-Capi or Open Memory Interface (OMI). Memory extension can be provided through the Open-Capi interface. Similar to CXL based devices, OMI performs media management. Row hammer mitigation can be implemented to OMI devices in a similar manner to CXL based devices.

A row hammer event such as a row hammer attack refers to undesirable changes in capacitor voltages of a row of memory cells as a result of a neighboring row being frequently accessed. A row hammer attack may be employed to intentionally alter, gain access to, and/or corrupt data stored in memory by repeatedly accessing a particular row in rapid succession. For instance, a first row that is adjacent to a second row may be accessed repeatedly over a relatively short time period of time. Accessing the first row repeatedly may leak voltage from memory cells coupled to the second row to memory cells coupled to the first row. The voltage leakage may cause data corruption to data stored in the memory cells coupled to the second row. The first row and the second row may not be directly adjacent but may be within a number of rows of each other. As used herein, memory cells and/or rows can be adjacent to each other if the memory cells and/or rows are physically located next to each other in a memory array or are within physical proximity sufficient to allow for the leakage of a charge from memory cells coupled to a row to different memory cells coupled to a different row. A row of memory cells can be next to a different row of memory cells if the addresses of the rows are consecutive and/or if there are no other rows between the adjacent rows. Memory cells may be adjacent to each other if the memory cells are coupled to rows that are adjacent to each other.

Moreover, due to various physical effects of shrinking manufacturing process geometries, row hammer thresholds of memory sub-systems have decreased to a level at which applications running on a host of a computer system can inadvertently corrupt their own data or the data of different applications sharing the same memory. As used herein, a row hammer threshold is a threshold quantity of accesses of a row of memory cells after which the memory cells in the row leak a charge.

Various row hammer detector algorithms may detect an occurrence of a row hammer event. However, such algorithms may not provide information which is useable to correlate the detected row hammer event to an error or other condition experienced by a memory system. For example, some row hammer detector algorithms may successfully detect and mitigate a row hammer event such that an error does not occur from the row hammer event. Yet, even in the absence of an error, performance of a memory system may change or degrade. However, such algorithms may not provide information representative of the occurrence of detection and mitigation of the row hammer event to a host or other entity.

Aspects of the present disclosure address the above and other deficiencies by implementing row hammer telemetry. For instance, row hammer telemetry can refer to the a value or indicative or a value of the refresh counter and/or a counter buffer that is provided via notification to a host or other entity. Thus, as detailed herein, row hammer telemetry can permit validation and/or improvement of existing row hammer mitigation techniques, permit correlation of an occurrence of a row hammer event to an error or other condition experienced by a memory system, and/or provide a notification (e.g., to a host) that includes or represents row hammer telemetry indicative of a detected row hammer event. Although the examples provided herein are in the context of row hammer attacks, the examples can also be applied to the loss of data due to memory cell leakage caused by accessing the memory cells or adjacent memory cells at a greater rate than a row hammer threshold (RHT).

Additionally, aspects of the present disclosure can also utilize a smaller memory (e.g., SRAM) size due to tracking a quantity of refresh management commands as opposed to other approaches which may seek to track addresses associated with refresh management commands. As used herein, a refresh management command (RFM) is defined by the JEDEC standard (e.g., JESD209-5A). An example of a refresh management command is a directed RFM command (dRFM).

A row hammer detector can be employed to facilitate aspects of row hammer telemetry. A row hammer detector can be included in a memory controller. The row hammer detector can be included in a given physical portions (e.g., a central portion, back-end portion, etc.) of the memory controller. For instance, in some embodiments, the row hammer detector can be included in a back-end portion of the memory controller. Moreover, in contrast to other approaches, embodiments herein employ row hammer detector-free memory devices. The row hammer detector herein can be located on and executed entirely on one or more portions of a memory controller, whereas other approaches rely on a row hammer detector on a memory device and thus are constrained by the computational power and/or size of the memory device. For example, other approaches may be constrained by a size of a buffer and/or a DIMM of a DRAM or other type of memory device. Thus, the accuracy, speed, and/or a reduction in any quantity of false negative/positives can be enhanced as compared to a detector that is limited by an amount of space/computational power available at a memory device, and thus may not be suitable for various aspects of row hammer telemetry, as detailed herein.

Interfaces such as peripheral component interconnect express (PCIe), compute express link (CXL), cache coherent interconnect for accelerators (CCIX), etc. allow connecting a variety of memory devices to a host system. The combination of interfaces and memory technology improvements can allow for deploying "far memory", which can consist of system memory (e.g., memory devices) being implemented behind a front-end of a memory sub-system such as PCIe, CXL, CCIX, GenZ., etc. As used herein, the front-end of the memory sub-system can also be referred to as an interface of the memory sub-system or as a front-end of a controller of the memory sub-system. The front-end of the memory sub-system can comprise hardware and/or firmware configured to receive data (e.g., requests and/or data) and provide the data to a back-end of the memory sub-system. The back-end of the memory sub-system can comprise hardware and/or firmware to receive the data (e.g., requests and/or data) from the front-end of the memory sub-system and can include perform the requests provided from the host on the memory devices of the memory sub-system.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected. It is to be understood that data can be transmitted, received, or exchanged by electronic signals (e.g., current, voltage, etc.) and that the phrase "signal indicative of [data]" represents the data itself being transmitted, received, or exchanged in a physical medium. The signal can correspond to a command (e.g., a read command, a write command, etc.).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. Analogous elements within a Figure may be referenced with a hyphen and extra numeral or letter. See, for example, elements 102-1, 102-2, 102-M in FIG. 1. Such analogous elements may be generally referenced without the hyphen and extra numeral or letter. For example, elements 102-1, 102-2, 102-M may be collectively referenced as 102. As used herein, the designators "M" and "N", particularly with respect to reference numerals in the drawings, indicates that a number of the particular feature so designated can be included. As will be appreciated, elements shown in the various embodiments herein can be added, exchanged, and/ or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a functional block diagram of a computing system 101 including a memory controller 100 having a front end portion 104, a central controller portion 110, and a back end portion 119. A host 103 and memory devices 126-1, . . . , 126-N (collectively referred to herein as memory devices 126) can be coupled to the memory controller 100. The memory controller 100 can be discrete from the one or more of the memory devices 126.

The front end portion 104 includes an interface and interface management circuitry to couple the memory controller 100 to the host 103 through input/output (I/O) lanes 102-1, 102-2, . . . , 102-M (collectively referred to as the I/O lanes 102) and circuitry to manage the I/O lanes 102. There can be any quantity of I/O lanes 102, such as eight, sixteen, or another quantity of I/O lanes 102. The I/O lanes 102 can be configured as a single port. The interface between the memory controller 100 and the host 103 can be a PCIe physical and electrical interface operated according to a CXL protocol.

The central controller portion 110 can include and/or be referred to as data management circuitry. The central controller portion 110 can control, in response to receiving a request from the host 103, performance of a memory operation. Examples of the memory operation include memory access request such as a read operation to read data from a memory device 126 or a write operation to write data to a memory device 126.

The central controller portion 110 can generate error detection information and/or error correction information based on data received from the host 103. The central controller portion 110 can perform error detection operations and/or error correction operations on data received from the host 103 or from the memory devices 126.

An example of an error detection operation is a cyclic redundancy check (CRC) operation. CRC may be referred to as algebraic error detection. CRC can include the use of a check value resulting from an algebraic calculation using the data to be protected. CRC can detect accidental changes to data by comparing a check value stored in association with the data to the check value calculated based on the data.

An example of an error correction operation is an error correction code (ECC) operation. ECC encoding refers to encoding data by adding redundant bits to the data. ECC decoding refers to examining the ECC encoded data to check for any errors in the data. In general, the ECC can not only detect the error but also can correct a subset of the errors it is able to detect.

The central controller portion 110 can implement low power chip kill (LPCK) error correction. As used herein, the term "chip kill" generally refers to a form of error correction that protects memory systems (e.g., the computing system 101 shown in FIG. 1) from any single memory chip failure as well as multi-bit error from any portion of a single memory chip. One approach for chip kill protection is on-the-fly correction implementation.

The back end portion 119 can include a media controller and a physical (PHY) layer that couples the memory controller 100 to the memory devices 126. As used herein, the term "PHY layer" generally refers to the physical layer in the Open Systems Interconnection (OSI) model of a computing system. The PHY layer may be the first (e.g., lowest) layer of the OSI model and can be used transfer data over a physical data transmission medium. In some embodiments, the physical data transmission medium can include channels 125-1, . . . , 125-N (collectively referred to herein as channels 125). The channels 125 can include a sixteen pin data bus and a two pin data mask inversion (DMI) bus, among other possible buses. The back end portion 119 can exchange (e.g., transmit or receive) data with the memory devices 126 via the data pins and exchange error detection information and/or error correction information with the memory devices 126 via the DMI pins. The error detection information and/or error correction information can be exchanged contemporaneously with the exchange of data. As illustrated in FIG. 1, the back end portion 119 can include a row hammer detector (RHD) 115. However, as detailed herein, in some embodiments the row hammer detector can be located elsewhere within the memory controller 100.

An example of the memory devices 126 is dynamic random access memory (DRAM) operated according to a protocol such as double data rate protocol DDRx (e.g., a low-power double data rate (LPDDRx), which may be referred to herein as LPDDRx DRAM devices, LPDDRx memory, etc.). The "x" in DDRx and LPDDRx refers to any of a number of generations of the protocol (e.g., LPDDR5).

The memory controller 100 can include a management unit 134 to initialize, configure, and/or monitor characteristics of the memory controller 100. The management unit 134 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the memory controller 100. As used herein, the term "out-of-band" generally refers to a transmission medium that is different from a primary transmission medium of a network. For example, out-of-band data and/or commands can be data and/or commands transferred to a network using a different transmission medium than the transmission medium used to transfer data within the network.

Figure 2:
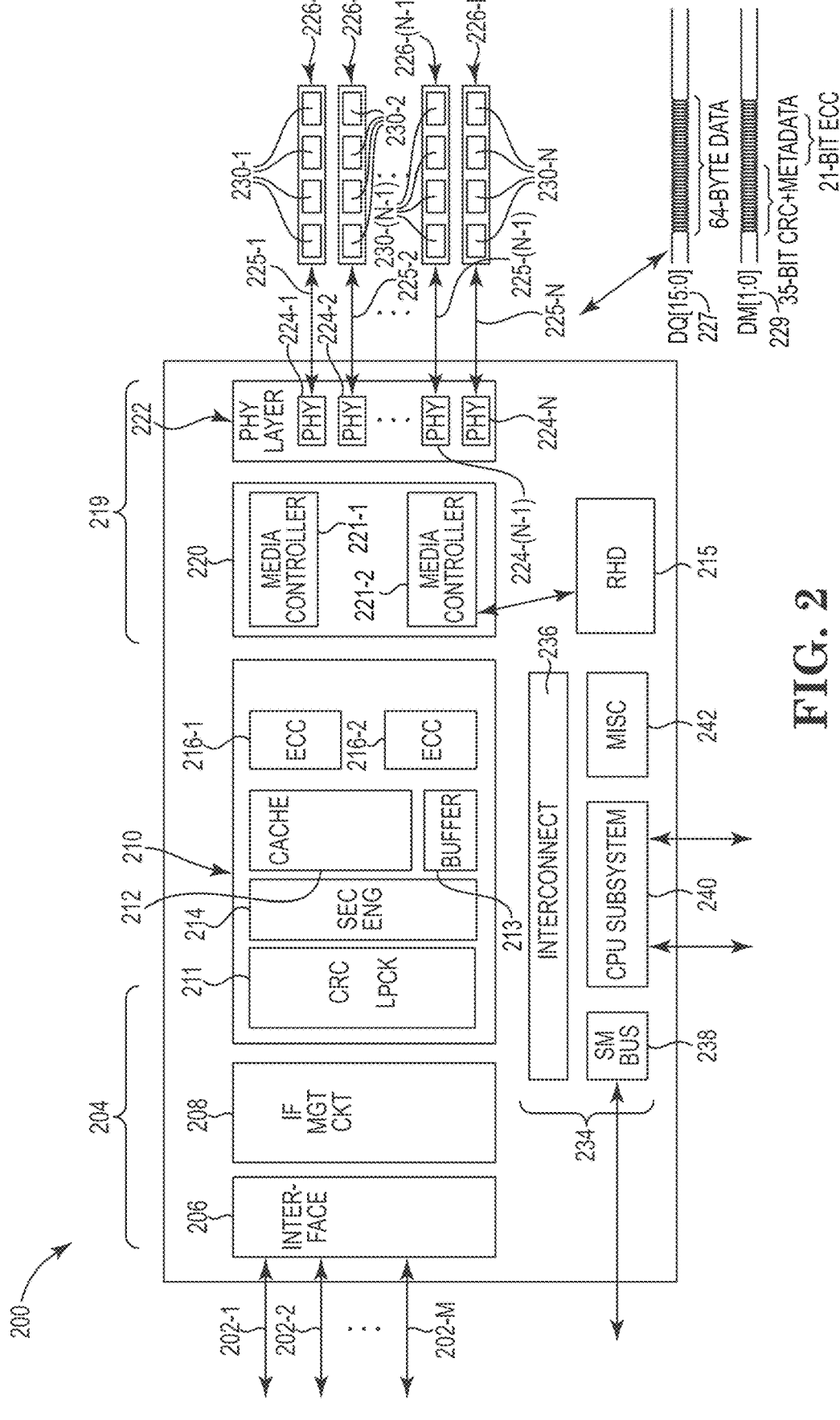
FIG. 2 is a functional block diagram of a memory controller including a row hammer detector in accordance with a number of embodiments of the present disclosure.

FIG. 2 is a functional block diagram of a memory controller 200. As shown in FIG. 2, a front end portion 204 can include an interface 206, which includes multiple I/O lanes 202-1, 202-2, . . . , 202-M, as well as interface management circuitry 208 to manage the interface 206. An example of the interface 206 is a peripheral component interconnect express (PCIe) 5.0 interface. In some embodiments, the memory controller 200 can receive access requests involving at least one of the cache memory 212 and the memory devices (e.g., die) 226-1, 226-2, . . . , 226-(N–1), 226-N via the interface 206 according to a non-deterministic memory protocol such as a CXL protocol. The interface 206 can receive data from a host (e.g., the host 103 shown in FIG. 1) through the I/O lanes 202. The interface management circuitry 208 may use a non-deterministic protocol such as CXL protocols to manage the interface 206 and may be referred to as CXL interface management circuitry 208. The CXL interface management circuitry 208 can be coupled to a host via the interface 206.

Central controller 210 (also referred to herein as data management circuitry 210) can be coupled to the interface management circuitry 208. The data management circuitry 210 can be configured to cause performance of a memory operation. The data management circuitry 210 can include at least one of error detection circuitry 211 (e.g., "CRC circuitry", and/or "LPCK circuitry") and error correction circuitry 216-1, 216-2. The error detection circuitry 211 can be configured to perform error detection operations on data. For example, the error detection circuitry 211 can be configured to generate a check value resulting from an algebraic calculation on data received from the interface management circuitry 208 and to transmit the check value to at least one of the cache memory 212, buffer 213, and media control circuitry 220. The check value can be referred to as CRC data or error detection data. The error detection circuitry 211 can be configured to perform an error detection operation on data received from the interface management circuitry 208 prior to the data being cached and/or operated on by the error correction circuitry 216-1, 216-2.

The data management circuitry 210 can include a cache memory (cache) 212 to store data, error detection information, error correction information, and/or metadata associated with performance of the memory operation. An example of the cache memory 212 is a thirty two (32) way set-associative cache memory including multiple cache lines. The cache line size can be equal to or greater than the memory controller 200 access granularity (e.g., 64 bytes for a CXL protocol). For example, each cache line can include 256 bytes of data. In another example, each cache line can include 512 bytes of data. Read and write requests of CXL memory systems can be 64 bytes in size. Therefore, data entries in the cache memory 212 can have 64 bytes of data. Each cache line can comprise 256 bytes. Therefore, multiple 64 byte requests can be stored in each cache line. In response to a request from the host, the memory controller 200 can write 256 bytes of data to a memory device 226. In some embodiments, the 256 bytes of data can be written in 64 byte chunks. Use of the cache memory 212 to store data associated with a read operation or a write operation can increase a speed and/or efficiency of accessing the data because the cache memory 212 can prefetch the data and store the data in multiple 64 byte blocks in the case of a cache miss. Instead of searching a separate memory device, the data can be read from the cache memory 212. Less time and energy may be used accessing the prefetched data than would be used if the memory system has to search for the data before accessing the data.

The data management circuitry 210 can include a buffer 213 to store data, error detection information, error correction information, and/or metadata subject to an operation thereon by another component of the data management circuitry 210 (e.g., the error detection circuitry 211, the error correction circuitry 216-1, 216-2). The buffer 213 can allow for the temporary storage of information, for example, while another component of the data management circuitry 210 is busy. In some embodiments, the cache memory 212 can be used to temporarily store data and the buffer 213 and/or can be used to temporarily store other information associated with the data, such as error detection information, error correction information, and/or metadata.

The error detection circuitry 211 can include low-power chip kill (LPCK) circuitry (not illustrated). The LPCK circuitry can be configured to perform chip kill operations on the data. The term "chip kill" generally refers to a form of error correction that protects memory systems (e.g., the computing system 101 shown in FIG. 1) from any single memory device 226 (chip) failure as well as multi-bit error from any portion of a single memory chip. The LPCK circuitry can increase the stability of the data and correct errors in the data. The LPCK circuitry can implement the desired LPCK protection collectively across subsets of the memory devices 226 (e.g., LPCK can be provided for a first subset of the memory devices 226-1, 226-2 and separately for s second subset of the memory devices 226-(N−1), 226-N) or across all of the memory devices 226. LPCK is considered to be "on-the-fly correction" because the data is corrected without impacting performance by performing a repair operation. The LPCK circuitry can include combinational logic that uses a feedforward process.

In contrast, a redundant array of independent disks (RAID) is considered to be "check-and-recover correction" because a repair process is initiated to recover data subject to an error. In some embodiments, the data management circuitry 210 includes RAID circuitry (not illustrated). For instance, the data management circuitry 210 can include RAID circuitry in lieu of LPCK circuitry. The RAID circuitry can provide one or more of data mirroring, data parity, striping, and combinations thereof depending on the particular implementation. The RAID circuitry can operate on data in conjunction with the error detection circuitry 211 to provide check-and-recover correction, whereas LPCK can provide on-the-fly correction. More specifically, the error detection circuitry can detect an error in data and the RAID circuitry can recover correct data in response.

As shown in FIG. 2, the data management circuitry 210 can include error correction circuitry 216-1 and 216-2 (collectively referred to herein as error correction circuitry 216) configured to perform error correction operations on the data (e.g., ECC encode the data and/or ECC decode the data). The error correction circuitry 216 can be coupled to the error detection circuitry 211 for embodiments (not specifically illustrated) that do not include the cache 212, buffer 213.

The security engine 214 can also be referred to as encryption circuitry 214. The encryption circuitry 214 can be configured to encrypt data before storing the data in memory devices 226 or cache memory 212 and/or decrypt data after reading the encrypted data from the memory devices 226 or the cache memory 212. An example of the encryption circuitry 214 is advanced encryption standard (AES) circuitry. However, in some embodiments the memory controller 200 can be provided without inclusion of the encryption circuitry.

In various embodiments, the memory controller 200 coupled to one or more of the number of memory devices includes a row hammer detector 215 located in the back end portion 219. As used herein, a row hammer detector refers to hardware and/or software or other logic that permits detection of a row hammer event. While illustrated in FIG. 2 as an individual row hammer detector, in some embodiments a plurality of row hammer detectors can be employed.

As shown in FIG. 2, the memory controller 200 can include a back end portion 219 including a media control circuitry 220 coupled to the data management circuitry 210. The media control circuitry 220 can include media controllers 221-1, 221-2. The back end portion 219 can include a physical (PHY) layer 222 having PHY memory interfaces 224-1, 224-2, . . . , 224-(N−1), 224-N. Each physical interface 224 is configured to be coupled to a respective memory device 226. As detailed herein, the row hammer detector 215 is disparate from the memory devices 226 and instead is included in the management unit 234 located apart from the memory devices 226. For instance, the row hammer detector 215 can be located in the back-end portion 219 of the memory controller 200. Though some or all of the row hammer detector 215 can be located at different portions of the memory controller 200.

The PHY layer 222 can be a memory interface to configured for a deterministic memory protocol such as a LPDDRx memory interface. Each of the PHY memory interfaces 224 can include respective data pins 227 and DMI pins 229. For example, each PHY memory interface 224 can include sixteen data pins 227 "[15:0]" and two DMI pins 229 "[1:0]". The media control circuitry 220 can be configured to exchange data with a respective memory device 226 via the data pins 227. The media control circuitry 220 can be configured to exchange error correction information, error detection information, and/or metadata via the DMI pins 229 as opposed to exchanging such information via the data pins 227. The DMI pins 229 can serve multiple functions, such as data mask, data bus inversion, and parity for read operations by setting a mode register. The DMI bus uses a bidirectional signal. In some instances, each transferred byte of data has a corresponding signal sent via the DMI pins 229 for selection of the data. In at least one embodiment, the data can be exchanged contemporaneously with the error correction information, row hammer telemetry information, and/or the error detection information. For example, 64 bytes of data can be exchanged (transmitted or received) via the data pins 227 while 35 bits of error detection information (and metadata) and 21 bits of error correction information are exchanged via the DMI pins 229. That is, in various embodiments the row hammer detector 215 and/or row hammer telemetry logic (not illustrated) included in the row hammer detector 215 can be located outside a data path (e.g., a path extending through the data pins 227). Such embodiments reduce what would otherwise be overhead on a bus for transferring error correction information, row hammer telemetry data, error detection information, and/or metadata.

The back end portion 219 can couple the PHY layer portion 222 to memory banks 230-1, 230-2, . . . , 230-(N-1), 230-N of memory devices 226-1, 226-2, . . . , 226-(N-1), 226-N. The memory devices 226 each include at least one array of memory cells. In some embodiments, the memory devices 226 can be different types of memory. The media control circuitry 220 can be configured to control at least two different types of memory. For example, the memory devices 226-1, 226-2 can be DDR memory such as a LPDDRx memory operated according to a first protocol and the memory devices 226-(N-1), 226-N can be LPDDRx memory operated according to a second protocol different from the first protocol. In such an example, the first media controller 221-1 can be configured to control a first subset of the memory devices 226-1, 226-2 according to the first protocol and the second media controller 221-2 can be configured to control a second subset of the memory devices 226-(N-1), 226-N according to the second protocol. In a specific example, the memory devices 226-1, 226-2 may have on board error correction circuitry. Although not specifically illustrated, for some embodiments, the media controller circuitry 220 can include a single media controller 221.

The memory controller 200 can include a management unit 234 configured to initialize, configure, and/or monitor characteristics of the memory controller 200. In some embodiments, the management unit 234 includes a system management (SM) bus 238. The SM bus 238 can manage out-of-band data and/or commands. The SM bus 238 can be part of a serial presence detect. In some embodiments, the SM bus 238 can be a single-ended simple two-wire bus for the purpose of lightweight communication. The management unit 234 can include a CPU subsystem 240, which can function as a controller for the management unit to execute instructions associated with initializing, configuring, and/or monitoring the characteristics of the memory controller 200. The management unit 234 can include miscellaneous circuitry 242, such as local memory to store codes and/or data associated with managing and/or monitoring the characteristics of the memory controller 200. An endpoint of the management unit 234 can be exposed to the host system (e.g., the host 103 shown in FIG. 1) to manage data. In some embodiments, the characteristics monitored by the management unit 234 can include a voltage supplied to the memory controller 200 and/or a temperature measured by an external sensor. The management unit 234 can include an interconnect 236, such as an advanced high-performance bus (AHB) to couple different components of the management unit 234.

The management unit 234 can include circuitry to manage in-band data (e.g., data that is transferred through the main transmission medium within a network, such as a local area network (LAN)). In some embodiments, the CPU subsystem 240 can be a controller that meets the Joint Test Action Group (JTAG) standard and operate according to an Inter-Integrate Circuit (I²C or I³C) protocol, and auxiliary I/O circuitry. JTAG generally refers to an industry standard for verifying designs and testing printed circuitry boards after manufacture. I²C generally refers to a serial protocol for a two-wire interface to connect low-speed devices like microcontrollers, I/O interfaces, and other similar peripherals in embedded systems. In some embodiments, the auxiliary I/O circuitry can couple the management unit 234 to the memory controller 200. Further, firmware for operating the management unit can be stored in the miscellaneous circuitry 242. In some embodiments, the miscellaneous circuitry 242 can be a flash memory such as flash NOR memory or other persistent flash memory device.

Figure 3A:
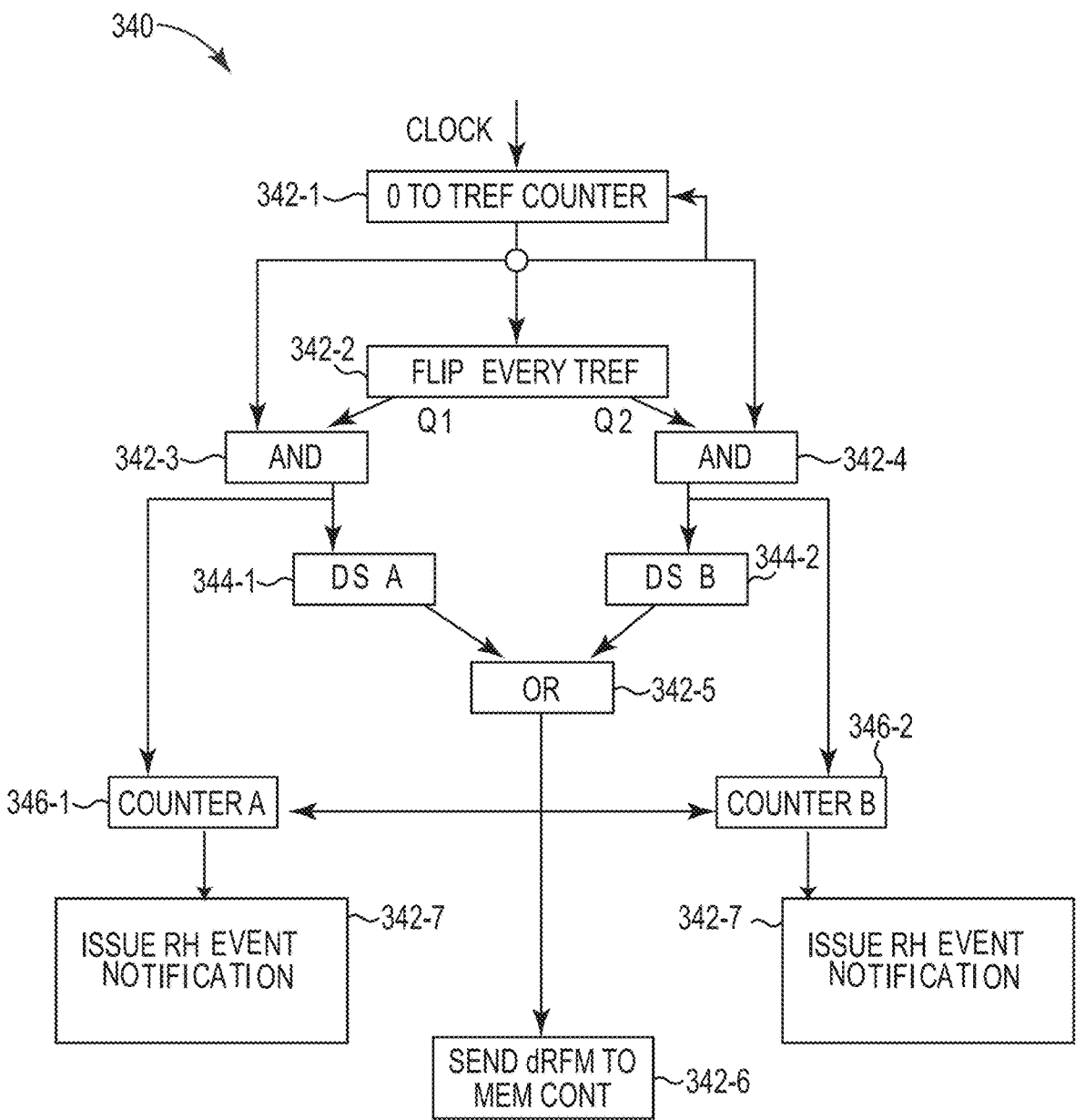
FIG. 3A is a flow diagram associated with a block diagram of a row hammer detector having a first configuration in accordance with a number of embodiments of the present disclosure.
Figure 3B:
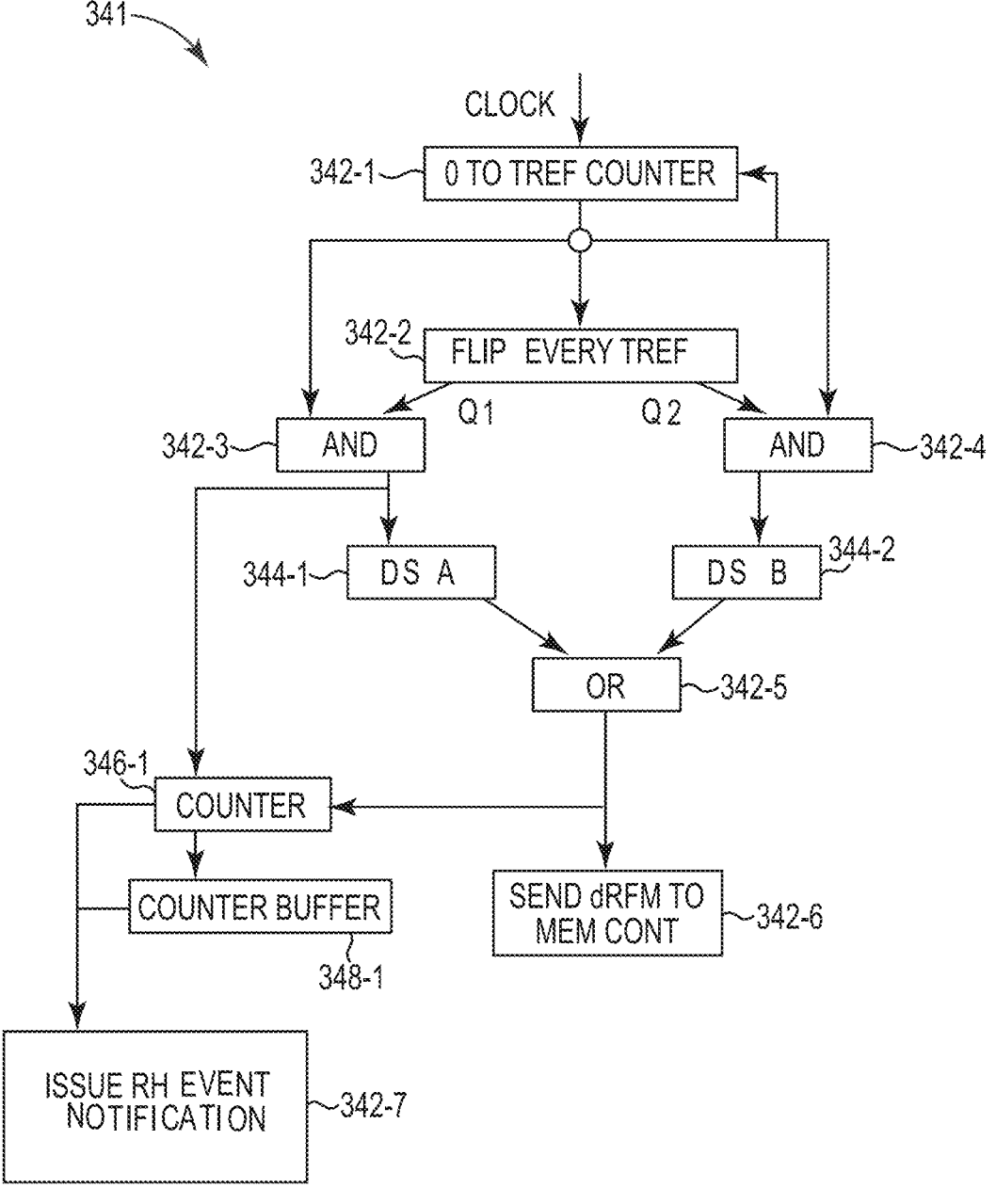
FIG. 3B is a flow diagram associated with a block diagram of a row hammer detector having a second configuration in accordance with a number of embodiments of the present disclosure.

FIG. 3A is a flow diagram 340 associated with a functional block diagram of a row hammer detector having a first configuration. FIG. 3B is a flow diagram 341 associated with a functional block diagram of a row hammer detector having a second configuration. FIG. 3A and FIG. 3B are directed to embodiments which are employed on a per-channel basis. Embodiments employed on a per-channel basis can use fewer components (e.g., refresh counters/counter buffers) and thus can be less costly and/or occupy a smaller physical footprint than embodiments such as those described with respect to FIG. 4 that are employed on a per-bank basis.

Row hammer detectors (e.g., such as row hammer detector 215 as illustrated in FIG. 2) can include a quantity of data structures, refresh counters, counter buffers, and/or row hammer telemetry logic, among other possible components. The row hammer detector of FIG. 3A and the row hammer detector of FIG. 3B can include a first data structure 344-1 and a second data structure 344-2. The first data structure 344-1 can be a first content-addressable memory (CAM) and the second data structure can be a second CAM. As an example, a CAM can be a static-random access memory (SRAM), among other possibilities.

The first data structure 344-1 and the second data structure 344-2 can be operated in a Ping-Pong fashion. For instance, both the first data structure 344-1 and the second data structure 344-2 can be incremented (e.g., for a quantity of row activations) in a 2*time period (tREF) windows (e.g., "Y" ms), but the resetting of the respective data structures (e.g., as indicated by "Q1" and "Q2" in FIG. 3A, FIG. 3B, and FIG. 4) are skewed by one time period (tREF) (e.g., "Y"/2 ms). Stated differently, the resetting of the respective data structures can be flipped back and forth for each time period, as detailed herein. In this way, when a given (e.g., first) data structure is reset (e.g., to a value of zero) the other (e.g., second) data structure can retain a count of a quantity of activations commands.

The row hammer detector of FIG. 3A can include a first refresh counter 346-1 and a second refresh counter 346-1. That is, in various embodiments the row hammer detector can include a plurality of refresh counters. In some embodiments, a quantity of refresh counters can be equal to at least a quantity of banks of memory in the number of memory devices. In some embodiments, a quantity of the refresh counters can be equal to at least a quantity of channels in the number of memory devices. In some examples, a quantity of the refresh counters can be equal to a quantity of data structures. In some embodiments, a quantity of the memory counter can be equal to at least twice a quantity of memory banks or at least twice a quantity of channels in a memory device.

As used herein, a refresh counter refers to a device which can store a quantity of times a refresh management command has been issued to a memory device over a time period. For instance, as illustrated in FIG. 3A the first quantity of refresh management commands issued can be transmitted to the first refresh counter 346-1 (Counter A) and the second quantity of refresh management commands issued can be transmitted to the second refresh counter 346-2 (Counter B). In some embodiments transmission of the first quantity of management commands (i.e., refresh commands) to the first refresh counter 346-1 can occur during the first time period and the transmission of the second quantity of refresh commands to the second refresh counter 346-2 can occur during the second time period. In some embodiments, the first refresh counter 346-1 can be incremented for each dRFM issued by command issued by the first data structure over a first time period, and the second refresh counter 346-2 can be incremented for each dRFM command issued by the second data structure 344-2 over a second time period.

However, the disclosure is not so limited. For instance, in some embodiments the first quantity of refresh management commands and/or the second quantity of refresh manage- ment commands can include refresh commands issues by another component such as a controller. That is, the quantity of refresh management commands can include refresh man- agement commands (e.g., a dRFM)

At 342-1 a clock signal can be provided. The clock signal can be associated with a time period (i.e., a reference time period). For instance, the clock signal can be employed in association with periodic resetting of a given component such as the first data structure 344-1, the second data structure 344-2, the first refresh counter 346-1, and/or the second refresh counter 346-2. In this way, a quantity of directed refreshes being performed to the rows over a time period ("ROW dRFMs PER tREF") can readily be deter- mined.

The quantity of directed refreshes performed can corre- spond to a quantity of dRFM commands issued by a data structure such as the first data structure 344-1 and/or the second data structure 344-2. At 342-2, a command can be issued to reset a counter, data table or other mechanism in the first data structure 344-1 after a first time period, and to reset a counter, data table, or other mechanism in the second data structure 344-2 after a second time period. In this way, the respective data structures can be reset alternatively (in a ping pong manner described herein) for a plurality of subsequent time periods.

In various examples, a duration of the first time period (e.g., Q1) is equal to a duration of the second time period (e.g., Q2). For instance, the duration of the first time period can be equal to "x" milliseconds and the duration of the second time period can also be equal to "x" milliseconds. That is, the first time period can occur immediately prior to the second time period such that the first time period and the second time period together form a continuous time interval having a duration of 2*"x" milliseconds.

As illustrated at 342-3, an operation can be performed to increment the first data structure 344-1 and increment the first refresh counter 346-1 over the first time period. Simi- larly, as illustrated at 342-4, an operation can be performed to increment the second data structure 344-2 and increment the second refresh counter 346-2 over the second time period. The first data structure 344-1 and the second data structure 344-2 can be incremented based a quantity of activation commands issued to a memory bank and/or a row, among other possibilities.

The first refresh counter 346-1 and the second refresh counter 346-2 can be incremented based on a quantity of refresh management commands issued such as a quantity of dRFM commands issued by an associated data structure, among other possibilities. For instance, the refresh manage- ment commands such as a dRFM command can be issued by a data structure when a row count in a data structure such as the first data structure 344-1 and/or the second data structure 344-2 exceeds a RHT.

At 342-5, it can be determined whether a quantity of dRFM commands exceeds a refresh threshold. For instance, it can be determined if a second value or a third value in a first refresh counter 346-1 exceeds a refresh threshold.

Similarly, in some embodiments, it can be determined if a quantity of dRFM commands in the first refresh counter 346-1 or a quantity of dRFM commands in the second refresh counter 346-2 exceeds a refresh threshold. While described herein with respect to dRFM commands other types of commands such as refresh management commands can be employed.

Responsive to a determination that the value of refresh counter exceeds the refresh threshold, a notification can be issued. For instance, a notification can be issued to a host to permit the host to issue a row hammer mitigation command responsive to receipt of the notification, among other pos- sibilities. Examples of row hammer mitigation commands include commands associated with performing a refresh operation such as a refresh operation to a row address of the row activation command and/or to one or more row addresses that are adjacent to the row address of the row activation command, altering a refresh mode/timing, return- ing "bad"/"poison" data to a host, causing an interrupt such as an interrupt at a host, and/or providing a notification such as notification provided to a controller and/or a host, among other possibilities. The row hammer mitigation command can mitigate any impact (e.g., charge leakage, data corrup- tion, power consumption, computation burden, etc.) associ- ated with row hammer.

In some examples, the row hammer mitigation command can cause each bank of a plurality of memory banks asso- ciated with a given channel to be refreshed. Such refreshing of each memory bank can be particularly beneficial in embodiments where a quantity of refresh management com- mands are tracked by incrementing counters and a row hammer event is detected based on the quantity of refresh management commands, as detailed herein, but correspond- ing addresses of the refresh management commands may not be tracked. For instance, in some embodiments a refresh counter can be incremented in the absence of storage of any specific address associated with each of the refresh man- agement (e.g., dRFM commands) in the refresh counter. Thus, a complexity, size, and/or quantity of components can be reduced as compared to other approaches that may seek to track an address (row address) associated with a refresh management command.

In some embodiments, a notification can be provided to a to a memory controller, as illustrated at 342-6 and/or a notification can be provided to a host, as illustrated at 342-7. The notification can be provided responsive to detection of an error (e.g., as detected by an error manager of a memory device), responsive to a user input (e.g., a user input pro- vided via a host), responsive to execution of a test script (e.g., a test script executing on a host), and/or responsive to a determination that a quantity of dRFM commands exceeds a refresh threshold as determined at 342-5, among other possibilities. In some embodiments responsive to detection of the error, a signal can be transmitted to a row hammer detector or otherwise transmitted to cause the value of the first refresh counter, the value of the second refresh counter, or both, to be outputted. In some examples, a value of a counter buffer coupled to the first refresh counter, the second refresh counter, or both, can be output responsive to an input.

Embodiments such as those illustrated in FIG. 3B can employ an individual refresh counter for each channel. However, additional refresh counters and/or counter buffers can be employed. For instance, two or more counter buffers can be employed as illustrated in the embodiments of FIG. 3A.

As mentioned, the first data structure 344-1, the second data structure 344-2, the first refresh counter 346-1, and the second refresh counter 346-2 can be reset. For instance, the first data structure 344-1 and the first refresh counter 346-1 can each be reset following elapse of a first time period, while the second data structure 344-2 and the second refresh counter 346-2 can each be reset following elapse of a second time period. In this way, the resetting of the first data structure 344-1 and the first refresh counter 346-1 can be offset by a full time period from resetting of the second data structure 344-2 and the second refresh counter 346-2. For instance, each of the first data structure 344-1 and the first refresh counter 346-1 can be reset following elapse a total of two time periods.

As mentioned, in some embodiments, a quantity of refresh management commands can be output from a refresh counter such as the first refresh counter prior to resetting the refresh counter. For instance, a quantity of refresh commands in a refresh counter can be output to a counter buffer coupled to the refresh counter.

Figure 4:
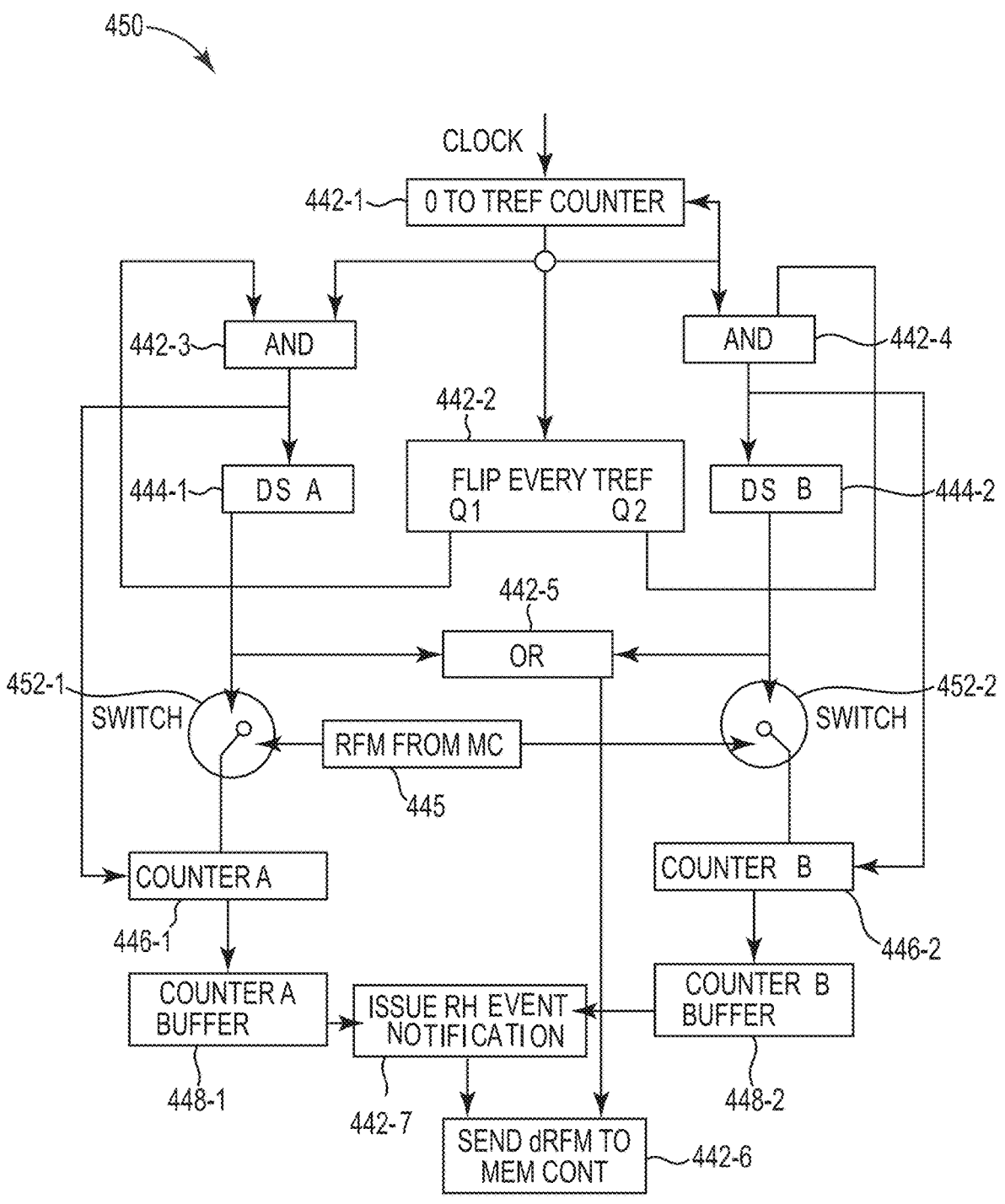
FIG. 4 is a flow diagram of a block diagram of row hammer detector having a third configuration in accordance with a number of embodiments of the present disclosure.

FIG. 4 is a flow diagram 450 associated with a row hammer detector having a third configuration. FIG. 4 is similar to FIG. 3A and FIG. 3B in that each are suitable for aspects of row hammer telemetry as detailed herein. For instance, FIG. 4 is directed to embodiments which are employed on a per-bank basis. Embodiments employed on a per-bank basis can provide an enhanced granularity of row hammer telemetry, for instance providing information that can indicate which memory bank is experiencing a row hammer event and/or is experiencing a change in operation (e.g., a relatively large quantity of refresh management commands) associated with an occurrence of a row hammer event.

The row hammer detector of FIG. 4 can include a first data structure 444-1 and a second data structure 444-2. For instance, the first data structure 444-1 can be a first content-addressable memory (CAM) and the second data structure 444-2 can be a second CAM.

The row hammer detector of FIG. 4 can include a first refresh counter 446-1 and a second refresh counter 446-2. As mentioned, a quantity of refreshes in the first refresh counter 446-1 can represent a quantity of refresh commands issued (e.g., by a first data structure 444-1) to a given memory bank (e.g., an individual memory bank) over at least a first time period, while the quantity of refresh commands in the second refresh counter 446-2 can represent a quantity of refresh commands issued (e.g., by a second data structure 444-2) to the memory bank (the same memory bank) over at least the second time period.

At 442-1 a clock signal can be provided, as detailed herein. At 442-2, a command can be issued to reset a counter, data table or other mechanism in the first data structure 444-1 after a first time period or to reset a counter, data table, or other mechanism in the second data structure 444-2 after a second time period. In this way, the respective data structures can be reset alternatively (in a ping pong manner described herein) for a plurality of subsequent time periods.

For instance, the first data structure 444-1 and the first refresh counter 446-1 can each be reset following elapse of a first time period, while the second data structure 444-2 and the second refresh counter 446-2 can each be reset following elapse of a second time period. In this way, the resetting of the first data structure 444-1 and the first refresh counter 446-1 can be offset by a full time period from resetting of the second data structure 444-2 and the second refresh counter 446-2.

Each of the first data structure 444-1 and the first refresh counter 446-1 can be reset following elapse a total of two time periods, as detailed herein. Similarly, each of the second data structure 444-2 and the second refresh counter 446-2 can be reset following elapse of two time periods. As mentioned, in some embodiments, a quantity of refresh management commands can be output from a refresh counter such as the first refresh counter prior to resetting the refresh counter. For instance, a quantity of refresh commands in a refresh counter can be output to a counter buffer coupled to the refresh counter prior to resetting the refresh counter.

At 442-3, an operation can be performed to increment the first data structure 444-1 (corresponding to a quantity of row activations) and increment a first refresh counter 446-1 over the first time period, as detailed herein. Similarly, as illustrated at 442-4, an operation can be performed to increment the second data structure 444-2 and increment the second refresh counter 446-2 over the second time period, as detailed herein. For instance, the first refresh counter 446-1 can be incremented based on or equal to a quantity of dRFM commands issued by the first data structure 444-1 over a first time period and the second refresh counter 446-2 can be incremented based on or equal to a quantity of dRFM commands issued by the second data structure 444-2 over a second time period.

Alternatively, or in addition, in some embodiments a quantity of refresh management commands can be issued by another component such as a memory controller or other controller, as represented at 445. In such embodiments, a first switch 452-1 can be operable to transmit signaling indicative of a first quantity of refresh management commands issued by a controller during the first time period to the first refresh counter 446-1. Thus, the first refresh counter 446-1 can be incremented to represent the first quantity of refresh commands issued by the controller and/or the first data structure 444-1 during the first time period. Similarly, a second switch 452-2 can be operable to transmit signaling indicative of a second quantity of refresh management commands issued by a controller during the second time period to the second refresh counter 446-2. Thus, the second refresh counter 446-2 can be incremented to represent a second quantity of refresh commands issued by the controller and/or the second data structure 444-2 during the second time period. Use of the switches 452-1, 452-2 allows reuse of the same counters and other components to collect row hammer telemetry regardless of whether the row hammer mitigation (e.g., whether dRFM commands are issued by) a controller or a row hammer detector.

Embodiments such as those illustrated in FIG. 4 can employ a two refresh counters for each memory bank. Such embodiments can employ a corresponding quantity of counter buffers. For instance, as illustrated in FIG. 4, two counter buffers can be employed such that the first refresh counter 446-1 has a corresponding first counter buffer 448-1 and the second refresh counter 446-2 has a corresponding second counter buffer 448-2.

At 442-5, it can be determined whether a quantity of dRFM commands exceeds a refresh threshold. For instance, it can be determined if a quantity of dRFM commands in the first refresh counter 446-1, the first counter buffer 448-1, the second refresh counter 346-2, and/or the second counter buffer 448-2 exceeds a refresh threshold. In some embodiments, it can be determined whether a quantity of dRFM commands in the first counter buffer 448-1 or a quantity of dRFM commands in the second counter buffer 448-2 exceeds the refresh threshold.

Responsive to a determination that the value of refresh counter exceeds the refresh threshold, a notification can be issued. For instance, a notification can be provided to a to a memory controller, as illustrated at 442-6 and/or a notification can be provided to a host, as illustrated at 442-7.

FIG. 5 is a flow diagram of a method employing row hammer telemetry. The methods described herein (e.g., with respect to FIG. 5, FIG. 6, and FIG. 7) can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 560 the method can include receiving, a memory controller, signaling indicative of an amount of row activations (e.g., an amount of row activation commands) having a row address in a memory device (e.g., the memory devices 126 as illustrated in FIG. 1). For instance, an interface (e.g., interface 206 as illustrated in FIG. 2) can receive data (e.g., receive a first signal indicative of data associated with a memory access request) from the host through the I/O lanes (e.g., I/O lanes 202 as illustrated in FIG. 2). The method can include receiving signaling indicative of a row activation command from a host by CXL interface management circuitry of the memory controller. In some embodiments, a row activation command can be received at a central controller of the memory controller. The signal can be received by or intercepted by a controller such as a central controller (e.g., central controller 210 as illustrated in FIG. 2).

The signaling can be received over a plurality of time periods including a first time period and a second time period. The second time period can occur immediately subsequent to the first time period such that that first and second time periods together form an uninterrupted (continuous) time period. While describe herein with regard to various time periods such as the first time period and the second time period it is to be understood that embodiments herein are not so limited and can be employed over a plurality of time periods extending beyond the first time period and the second time period.

At 562, a row counter in a first data structure and a refresh counter can be incremented over the first time period, as detailed herein. For instance, a row counter corresponding to the row address can be incremented, as detailed herein.

The value of the refresh counter can be representative of a quantity of refresh management commands such as directed refresh management commands issued over a given time period. For instance, the value of the refresh counter can be representative of a quantity of refresh management commands issued via one or more respective channels to one or more memory banks of a memory device, as detailed herein. Such embodiments can operate on a per-channel basis, as detailed herein. However, in some embodiments the value of the refresh counter can be equal to a respective quantity of refresh commands issued over a given time period to one or more memory banks of a memory device. Such embodiments can operation on a per-bank basis, as detailed herein.

The row counter and/or the refresh counter can be incremented by a predetermined amount. For instance, the row counter and/or the refresh counter can be incremented by one or by a value greater than one. For example, the row counter can be incremented by one each time an access command having a row address is received by the memory sub-system and the refresh counter can be incremented by one each time a refresh management commend (e.g., a directed refresh management command) is issued. The refresh management commands can be issued by various components such as the first data structure, the second data structure, a media controller, and/or another component included in the memory controller. In some embodiments, the refresh counter can be incremented from a first value to a second value over the first time period. In such embodiments, the first value and/or the second value can represent respective quantities of dRFM commands issued by the first data structure via a respective channel to memory banks of the memory device over the first time period. For instance, the second value can represent respective quantities of dRFM commands issued by the first data structure via a respective channel to memory banks of the memory device over the first time period.

At 564, a row counter in a second data structure and a refresh counter can be incremented over the second time period. For instance, a row counter corresponding to the row address can be incremented, and the refresh counter can be incremented from the second value to a third value, as detailed herein. In such embodiments, the third value of the refresh counter can represent the respective quantity of dRFM commands issued by the first data structure and a quantity of dRFM commands issued by the second data structure via the respective channel to the memory banks of the memory device. Stated differently, the third value can be equal to a sum of represent the respective quantity of dRFM commands issued by the first data structure and a quantity of dRFM commands issued by the second data structure via the respective channel to the memory banks of the memory device.

A determination can be made as to whether the row counter in the first data structure and/or the row counter in the second data structure is greater than a RHT. The determination can be made at a controller of the memory sub-system.

Responsive to a determination that the row counter is greater than a RHT, a row hammer mitigation command to mitigate row hammer can be issued. For instance, a dRFM command can be issued to the row address and/or to other row address such as to rows which are physically adjacent to the row address. However, other mitigation mechanisms such as those detailed herein are possible. Conversely, a determination that the row counter is less than (or equal to) a RHT can indicate that there are not negative implications to processing the access command and the access command can be permitted.

At 566, a determination can be made as to whether a value of the refresh counter exceeds a refresh threshold. As used herein, a refresh threshold refers to given quantity of refresh management commands issued over a given time period (e.g., the first time period or the second time period). In some embodiments, the refresh threshold can be a fixed quantity of refresh management commands stored in a memory controller. At 568, responsive to a determination that the refresh counter is greater than the refresh threshold, a notification can be issued.

FIG. 6 is a flow diagram of another method employing row hammer telemetry. At 670, signaling indicative of an amount of row activations directed to a row of a memory device of a memory sub-system can be received over a first time period and a second time period.

At 672, a row counter in a first data structure and a first refresh counter can be incremented over the first time period, as detailed herein. Similarly, at 674, a row counter in a second data structure and a second refresh counter can be incremented over the second time period, as detailed herein.

In some embodiments, the value of the first refresh counter can be employed on a per-bank basis to track a quantity of refresh management commands issued over a given time period for a respective bank in a memory device. For instance, the value of the first refresh counter can be representative of a quantity of refresh commands received by a memory bank over the first time period and the value of the second refresh counter can be representative of a quantity of refresh commands received by the memory bank over the second time period.

At 676, a determination can be made as to whether a value of the first refresh counter and/or the second refresh counter exceeds a refresh threshold. For instance, the value of the first refresh counter can be compared to the refresh threshold during and/or subsequent to the first time period and the value of the second refresh counter can be compared to the refresh threshold during and/or subsequent to the second time period. The value of the first refresh counter and the value of the second refresh counter can be compared to the same refresh threshold. At 678, responsive to a determination that the value of the first refresh counter and/or the second refresh counter is greater than the refresh threshold, a notification (e.g., a notification to a host) can be issued.

FIG. 7 is a flow diagram of yet another method employing row hammer telemetry. At 780, signaling indicative of an amount of row activations directed to a row of a memory device of a memory sub-system can be received over first time period and a second time period, as detailed herein.

At 782, a row counter in a first data structure and a first refresh counter can be incremented over the first time period, as detailed herein. Similarly, at 784, a row counter in a second data structure and a second refresh counter can be incremented over the second time period, as detailed herein. For instance, the refresh counters and/or the row counters can be incremented and reset in an offset manner, as detailed herein.

As mentioned, the value of a refresh counter such as the first refresh counter and/or the second refresh counter can be representative of a quantity of refresh management commands such as directed refresh management commands issued over a given time period. In some embodiments, a value of the first refresh counter can be incremented on a per-bank basis to track a quantity of refresh management commands issued over a given time period (e.g., a first time period) for a respective memory bank in a memory device. For instance, a value of the first refresh counter can be representative of a quantity of refresh commands received by a memory bank over a first time period and a value of the second refresh counter can be representative of a quantity of refresh commands received by the memory bank over the second time period.

As mentioned, a determination can be made as to whether an incremented value (e.g., a second value) of the row counter in the first data structure and/or an incremented value (e.g., a third value) the row counter in the second data structure is greater than a RHT. As mentioned, responsive to a determination that the row counter is greater than a RHT, a row hammer mitigation command to mitigate row hammer can be issued.

At 786, a value of the first refresh counter, a value of the second refresh counter, or both can be output responsive to an input. Examples of suitable inputs include detection of an error associated with a memory device (e.g., as detected by an error manager of the memory device), responsive to a user input (e.g., a user input provided via a host device), and/or responsive to execution of a test script (e.g., a test script executing on a host device), among other possibilities. For instance, responsive to detection of the error, a signal can be transmitted to a row hammer detector or otherwise to cause the value of the first refresh counter, the value of the second refresh counter, or both, to be output.

The value of the refresh counter(s) can be output to a counter buffer and/or to a host. For example, the value of the first refresh counter, the value of the second refresh counter, or both, can output to a counter buffer prior to resetting the first refresh counter, the second refresh counter, or both, respectively. In this way, the value(s) of the refresh counters can be stored in the counter buffer thus can promote readily comparing the value(s) of the refresh counter(s) to a refresh threshold. In this way, it can be readily determined whether the refresh threshold is exceeded and, in some embodiments whether a detected error (e.g., a LPCK correctable error, a correctable error, etc.) may be attributable to an occurrence of a row hammer event.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a number of memory devices; and
a memory controller coupled to one or more of the number of memory devices, the memory controller including a row hammer detector and being configured to:
increment for a first time period:
a row counter in a first data structure; and
a refresh counter based on a quantity of directed refresh management (dRFM) commands issued by the first data structure during the first time period;

increment for a second time period:

a row counter in a second data structure; and the refresh counter based on a quantity of dRFM commands issued by the second data structure during the second time period;

determine that a value of the refresh counter is less than a refresh threshold; and responsive to the determination that the value of the refresh counter is less than the refresh threshold, determine that an access command is permitted to be performed.

2. The apparatus of claim 1, wherein the memory controller is further configured to periodically reset the refresh counter subsequent to elapse of the second time period, and wherein a duration of the first time period is equal to a duration of the second time period.

3. The apparatus of claim 1, further comprising a counter buffer coupled to the refresh counter, and wherein the memory controller is further configured to:

store a value of the refresh counter in the counter buffer; and subsequent to storage of the value of the refresh counter in the counter buffer, reset the refresh counter.

4. The apparatus of claim 1, wherein the first data structure is a first content-addressable memory (CAM), and wherein the second data structure is a second CAM.

5. The apparatus of claim 1, wherein the refresh counter is incremented for each dRFM command issued via the respective channel to memory banks of the number of memory devices, and wherein the refresh counter is incremented in the absence of storage of any specific address associated with each of the dRFM commands.

6. A method comprising:

receiving, at a memory controller of a memory sub-system, signaling indicative of an amount of row activations directed to a row of a memory device of the memory sub-system over a first time period and a second time period;

incrementing over the first time period:

a row counter in a first data structure; and a refresh counter from a first value to a second value, wherein the second value represents quantities of directed refresh management (dRFM) commands issued by the first data structure via a respective channel to memory banks of the memory device;

incrementing over the second time period:

a row counter in a second data structure; and the refresh counter from the second value to a third value, wherein the third value represents the respective quantity of dRFM commands issued by the first data structure and a quantity of dRFM commands issued by the second data structure via the respective channel to the memory banks of the memory device;

determining a value of the refresh counter exceeds a refresh threshold; and responsive to the determination that the refresh threshold is exceeded, correlating the determination that the refresh threshold is exceeded to an error in the memory sub-system.

7. The method of claim 6, further comprising resetting the refresh counter from the third value to the first value subsequent to elapse of the second time period.

8. The method of claim 7, further comprising resetting the row counter in the first data structure.

9. The method of claim 8, further comprising:

subsequent to incrementing the row counter in the second data structure, incrementing over a third time period:

the row counter in the first data structure from a first value to a second value; and the refresh counter from the first value to a second value.

10. The method of claim 6, further comprising resetting the row counter in the first data structure and the refresh counter subsequent to elapse of the first time period.

11. The method of claim 10, further comprising resetting the row counter in the second data structure and the refresh counter subsequent elapse of the second time period.

12. The method of claim 6, further comprising outputting the first value of the refresh counter, the second value of the refresh counter, or both, to a counter buffer.

13. The method of claim 12, further comprising outputting the first value, the second value, or both, prior to resetting the refresh counter.

14. An apparatus, comprising:

a number of memory devices; and a memory controller coupled to one or more of the number of memory devices, the memory controller including a row hammer detector and being configured to:

increment for a first time period:

a row counter in a first data structure; and a first refresh counter to represent a quantity of directed refresh management (dRFM) commands issued by the first data structure to a memory bank during the first time period;

increment for a second time period:

a row counter in a second data structure; and a second refresh counter to represent a quantity of dRFM commands issued by the second data structure to the memory bank during the second time period;

determine that an incremented value of the first refresh counter or an incremented value of the second refresh counter exceeds a refresh threshold; and responsive to the determination that the refresh threshold is exceeded, correlate the determination that the refresh threshold is exceeded to an error in the number of memory devices.

15. The apparatus of claim 14, further comprising a first counter buffer coupled to the first refresh counter and a second counter buffer coupled to the second refresh counter, and wherein the memory controller is further configured to:

store the incremented value of the first refresh counter in the first counter buffer; and subsequent to storage of the incremented value of the first refresh counter in the first counter buffer, reset the first refresh counter; and increment for a third time period:

the row counter in the first data structure; and the first refresh counter.

16. The apparatus of claim 14, wherein:

the memory controller is further configured to periodically reset the incremented value of the first refresh counter and the incremented value of the second refresh counter; and the memory controller is further configured to refresh the incremented value of the first refresh counter subsequent to elapse of an individual time period, and wherein the memory controller is further configured to periodically refresh the incremented value of the second refresh counter subsequent to elapse of two time periods.

17. The apparatus of claim 14, wherein:

the first refresh counter and the second refresh counter are included in a plurality of refresh counters, and wherein the first data structure and the second data structure are included in a plurality of data structures, and wherein a quantity of the plurality of refresh counters is equal to a quantity of the plurality of data structures; and the quantity of the plurality of the refresh counters is equal to at least a quantity of banks of memory in the number of memory devices, and wherein the quantity of the plurality of the refresh counters is equal to at least a quantity of channels in the number of memory devices.

18. The apparatus of claim 17, wherein the quantity of the plurality of the refresh counters is equal to at least twice a quantity of banks of memory in the number of memory devices, and wherein the quantity of the plurality of the refresh counters is equal to at least twice a quantity of channels in the number of memory devices.

19. The apparatus of claim 14, further comprising:

a first switch coupled to the first data structure configurable to selectively receive directed refresh management commands from the first data structure or the controller; and a second switch coupled to the second data structure configurable to selectively receive directed refresh management commands from the second data structure or the controller.

20. The apparatus of claim 14, wherein the row hammer detector is located outside of a data path in the memory controller.

\* \* \* \* \*